United States Patent
Oates

(10) Patent No.: US 10,074,988 B2
(45) Date of Patent: Sep. 11, 2018

(54) OBSERVER BASED MONITORING AND CONTROL OF SUBMODULES IN MODULAR MULTILEVEL CONVERTER

(71) Applicant: Alstom Technology Ltd., Baden (CH)

(72) Inventor: Colin Oates, Brocton (GB)

(73) Assignee: ALSTOM TECHNOLOGY LTD (CH)

( * ) Notice: Subject to any disclaimer, the term of this patent is extended or adjusted under 35 U.S.C. 154(b) by 141 days.

(21) Appl. No.: 15/101,134

(22) PCT Filed: Dec. 5, 2014

(86) PCT No.: PCT/EP2014/076753
§ 371 (c)(1),
(2) Date: Jun. 2, 2016

(87) PCT Pub. No.: WO2015/082698
PCT Pub. Date: Jun. 11, 2015

(65) Prior Publication Data
US 2016/0308360 A1  Oct. 20, 2016

(30) Foreign Application Priority Data
Dec. 5, 2013  (EP) ..................................... 13195871

(51) Int. Cl.
*H01H 47/00* (2006.01)
*H02J 3/36* (2006.01)
(Continued)

(52) U.S. Cl.
CPC .................. *H02J 3/36* (2013.01); *H02M 1/32* (2013.01); *H02M 5/458* (2013.01); *H02M 7/483* (2013.01);
(Continued)

(58) Field of Classification Search
CPC ........ G01R 31/40; H02M 1/32; H02M 7/483; H02M 2001/0025; H02M 2007/4835; H02M 5/458; H02J 3/36
See application file for complete search history.

(56) References Cited

U.S. PATENT DOCUMENTS 9,343,989 B2 *  5/2016  Baruschka ............ H02M 5/293
9,673,654 B2 *  6/2017  Beauregard ........... H02J 7/0024
(Continued)

FOREIGN PATENT DOCUMENTS

| EP | 2 100 365 A1 | 9/2009 |
|---|---|---|
| EP | 2677653 A1 | 12/2013 |
| WO | 2013/011134 A1 | 1/2013 |

OTHER PUBLICATIONS

Hamed Nademi et al: "Capacitor Voltage Monitoring in Modular Multilevel Converter", Conference Proceedings Power Electronics South America 2012, Sao Paulo, Brazil, Sep. 11, 2012 (Sep. 11, 2012); Retrieved from the Internet: URL:http://www.elkraft.ntnu.no/eno/Papers2012/Hamed-Brasil.pdf.
(Continued)

*Primary Examiner* — Jared Fureman
*Assistant Examiner* — Duc M Pham
(74) *Attorney, Agent, or Firm* — Parks IP Law LLC

(57) ABSTRACT

This application relates to control methods and apparatus for a voltage source converter comprising a plurality of energy storage devices which can be selectively connected into an arm of the voltage source converter. The apparatus is configured to generate a modelled value of the voltage of an energy storage device of the voltage source converter based on one or more model parameters and the operation of the voltage source converter, receive the modelled value and also a measured value of the voltage of at least one energy storage device, determine an error between the modelled value and the measured value, and generate a model control
(Continued)

signal for adapting the model based on said error so that the modelled value substantially corresponds to the measured value. Control circuitry is responsive to said model module and/or said model adaptation module to control operation of the voltage source converter.

13 Claims, 6 Drawing Sheets

(51) Int. Cl.
    *H02M 1/32*     (2007.01)
    *H02M 7/483*     (2007.01)
    *H02M 5/458*     (2006.01)
    *G01R 31/40*     (2014.01)
    *G01R 31/02*     (2006.01)
    *H02M 1/00*     (2006.01)

(52) U.S. Cl.
    CPC ............ *G01R 31/028* (2013.01); *G01R 31/40* (2013.01); *H02M 2001/0025* (2013.01); *H02M 2007/4835* (2013.01)

(56) References Cited

U.S. PATENT DOCUMENTS

2012/0314466 A1* 12/2012 Goerges ............ H02M 7/53873
    363/78

2014/0152109 A1* 6/2014 Kanakasabai ........... H02J 9/062
    307/66

OTHER PUBLICATIONS

Anonymous: "PhD projects, Department of Electric Power Engineering, NTNU", May 31, 2013 (May 31, 2013), pp. 1-46, XP055118887, Retrieved from the Internet: URL:http://www.ntnu.edU/documents/139952/0/PhDsuirmary2013.pdf/d86bacda-6b2b-4fad-a2f9-b9830bad84a5.

Philipp Munch et al: "Modeling and current control of modular multilevel converters considering actuator and sensor delays", IEC0N 2009—35th Annual Conference of IEEE Industrial Electronics (IEC0N 2009)—Nov. 3-5, 2009—Porto, Portugal, IEEE, Piscataway, NJ, USA, Nov. 3, 2009 (Nov. 3, 2009), pp. 1633-1638, XP031629417, ISBN: 978-1-4244-4648-3.

Anonymous: "Conference Program Power Electronics South America 2012", Sep. 11, 2012 (Sep. 11, 2012), pp. 1-13, XP055118878, Retrieved from the Internet: URL:http://www.mesago.de/v3/download.php?name=Short_Descripti on_Proceedi ngs.pdf&c_i d=8000&file= short description proceedings_2.pdf.

European Search Report in corresponding European application No. 13195871.2 dated May 30, 2014.

International Search Report in corresponding PCT application No. PCT/EP2014/076753 dated Feb. 10, 2015.

First Office Action and Search issued in connection with corresponding CN Application No. 201480066342.1 dated Oct. 30, 2017.

\* cited by examiner

OBSERVER BASED MONITORING AND CONTROL OF SUBMODULES IN MODULAR MULTILEVEL CONVERTER

This application relates to methods and apparatus for the monitoring and control of Voltage Source Converters and especially to monitoring and control of sub-modules in a Multilevel Modular Converter.

HVDC (high-voltage direct current) electrical power transmission uses direct current for the transmission of electrical power. This is an alternative to alternating current electrical power transmission which is more common. There are a number of benefits to using HVDC electrical power transmission.

In order to use HVDC electrical power transmission, it is typically necessary to convert alternating current (AC) to direct current (DC) and back again. Historically this has been done by using thyristors which are sometimes known as line-commutated converters (LCC).

Recent developments in the power electronics field have led to an increased use of voltages-source converters (VSC) for AC-DC and DC-AC conversion. VSCs typically comprise six converter arms (for a three phase AC input/output), each of which connects one DC terminal to one AC terminal. Each arm comprises an apparatus which is termed a valve and which typically comprises a plurality of sub-modules which may be switched in a desired sequence. In a Multi-level Modular Converter (MMC) each sub-module typically comprises a capacitor as an energy storage element and switching elements for selectively connecting the capacitor in series between the terminals of the sub-module or bypassing the capacitor. The sub-modules are controlled in a sequence to progressively vary the number of energy storage elements which are connected in series in an arm of the converter so as to provide multilevel voltage shifting between the voltages at the AC and DC terminals.

For control of such a VSC it can be advantageous to monitor the voltages of the capacitors of the sub-modules and control the switching of the sub-modules based on the monitored voltages. It has therefore been proposed to measure the voltage of each sub-module capacitor and provide feedback signals, indicative of the voltages of the individual sub-module capacitor voltages, to a central control unit.

It has been found however that the voltage feedback signals from the sub-module capacitors may suffer from relatively significant amounts of noise which can adversely affect the control system. The noise can be reduced by filtering the feedback signals, however for some VSC control systems the sample rate required for the control system may be relatively fast, for example of the order of 100 µs or so, which will limit the amount of filtering that can be applied—especially as in practice there may be a large number of separate sub-modules, for example more than 2000, and samples from every sub-module will need to be processed within a fraction of this sample period.

In addition the value of capacitance of the capacitors of the sub-modules can change over time. It is common for the capacitors of the sub-modules to be based on metallised film technology, which is typically patterned so that if the dielectric film of the capacitor breaks down in one section that section can isolate itself from the rest of the capacitor. The metallisation is segmented into small patches that are connected to one another by thin strips. If the dielectric breaks down in one area the thin strips act as fuses and thus detach the damaged area from the rest of the capacitor. Whilst this allows the capacitor to continue to be used, albeit with a reduced capacitance, it would be beneficial to monitor the capacitance of the sub-modules so as to identify such degradation.

Embodiments of the present invention therefore provide methods and apparatus for monitoring the parameters of the sub-modules of a VSC that at least mitigate at least some of the above mentioned disadvantages.

Thus according to the present invention there is provided a control apparatus for a voltage source converter comprising a plurality of energy storage devices which can be selectively connected into an arm of the voltage source converter, the apparatus comprising:
  a model module configured to generate a modelled value of the voltage of at least one of the energy storage devices of the voltage source converter based on one or more model parameters and the operation of the voltage source converter;
  a model adaptation module configured to receive the modelled value and also a measured value of the voltage of the at least one energy storage device, to determine an error between said modelled value and said measured value, and to generate a model control signal for adapting the model based on said error so that the modelled value substantially corresponds to the measured value; and
  control circuitry responsive to said model module and/or said model adaptation module.

The model may be configured to receive at least one feedback signal indicative of the electrical properties of the voltage source converter, which may be a current feedback signal indicative of the current flowing in the converter arm and/or a voltage feedback signal.

The model module thus generates a modelled value of the voltage of at least an energy storage device.

In such embodiments the control circuitry may be configured to receive the modelled value of the voltage of an energy storage device and control said selective connection of said energy storage devices based on the modelled value for said energy storage devices. The control circuitry may be configured to generate switching control signals for controlling the selective connection of the plurality of energy storage devices and the model module may be responsive to said switching control signals.

At least one model parameter may be related to the capacitance of an energy storage device. The model module may be configured to receive a current feedback signal indicative of the current flowing in the converter arm and, for an energy storage device which is selectively connected into the converter arm model a change in voltage by scaling the current signal by said parameter related to the capacitance of that energy storage device and integrate the scaled current signal.

In some embodiments the model control signal comprises a feedback control signal for adding a compensation term into the signal path of the model module. In other embodiments the model control signal is a control signal configured to adjust a parameter related to the capacitance of an energy storage device.

In some embodiments the control circuitry is configured to monitor a measure of said error between said modelled value and said measured value. The measure of the error may be at least one of: the root mean square value of the determined error between said modelled value and said measured value; the root mean square value of the model control signal and the amount of any adaptation of a model parameter.

The measure of the error and/or any variation in said measure of the error may be monitored against one or more threshold values. In the event that a threshold value is exceeded for a given energy storage device the control circuitry may be configured to generate an alarm indicating a potential problem with said energy storage device and/or to deactivate said energy storage device.

In some embodiments at least one filter may be configured to apply filtering to the measured value of the voltage of an energy storage device, e.g. sub-module capacitor. The control circuitry may be configured to sample the modelled value of the voltage of an energy storage device at a sample rate which is faster than the adaptation module samples the measured value.

In some embodiments processing circuitry may be configured to run at least part of said model module and/or at least part of said model adaptation module. In some embodiments however at least part of the model may be implemented in hardware and the model module comprises at least some hardware circuit components configured so as to model the behaviour of the modelled components of the voltage source converter.

The model module may be configured to model all of energy storage devices which can be selectively connected into an arm of the voltage source converter.

Embodiment of the invention relate to a voltage source converter comprising at least one control apparatus as described above. The voltage source converter may comprise a plurality of converter arms and there may be a control apparatus as described for each converter arm. Embodiment of the invention also relate to a high voltage direct current power distribution system comprising a voltage source converter as described.

In another aspect of the invention there is provided a method of controlling a voltage source converter having an energy storage device that can be selective connected into an arm of the voltage source converter, the method comprising:
generating a modelled value of the voltage of the energy storage device of the voltage source converter based on one or more model parameters and the operation of the voltage source converter;
receiving the modelled value for the first electrical parameter and also a measured value of the voltage of the energy storage device, determining the error between the modelled value and the measured value, and generating a model control signal to adjust the model as necessary so that the modelled value substantially corresponds to the measured value; and
controlling the voltage source converter based on an output of the model.

The method offers all of the same advantages and may be used in all of the same variants as discussed above in relation to the first aspect of the invention.

In another aspect there is provided computer readable code stored on a non-transitory storage medium which, when run on a suitable processor, performs the method discussed above.

The invention will now be described by way of example only with reference to the following drawings, of which:

Figure 5A:
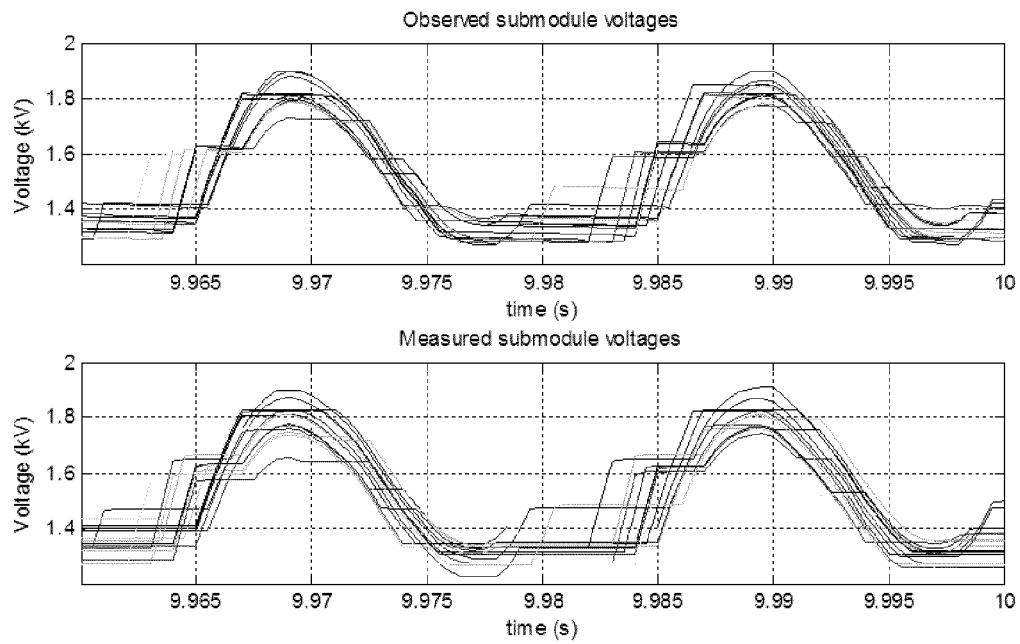
Figure 5B:
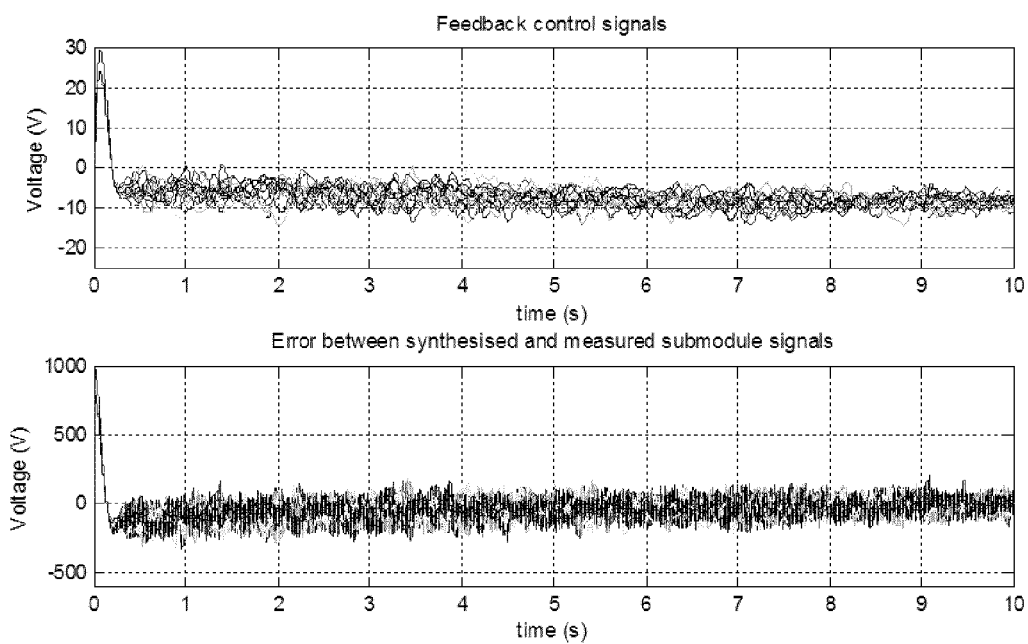
Figure 6A:
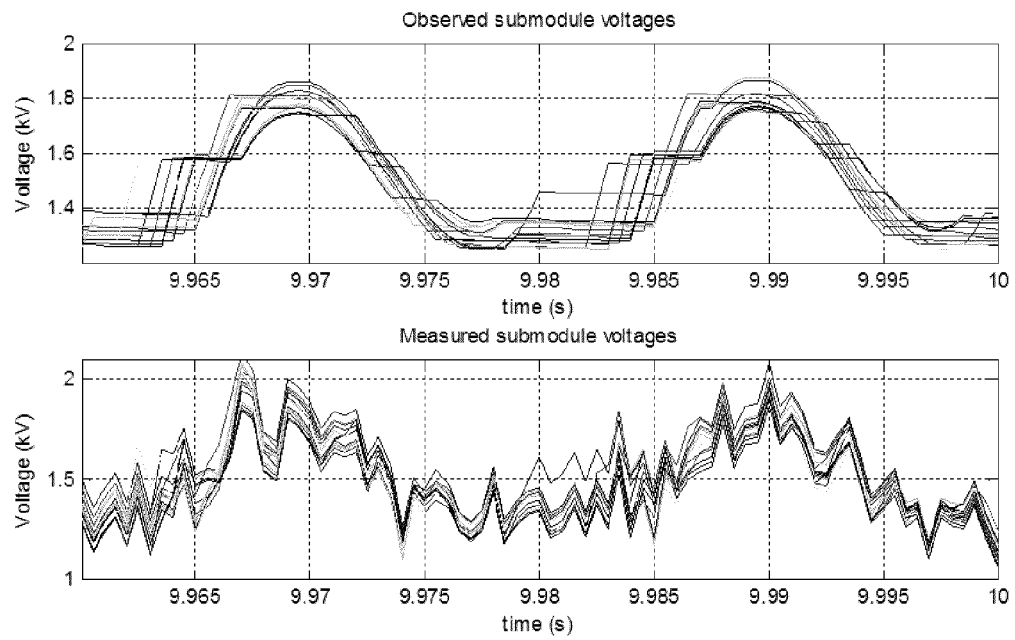
Figure 6B:
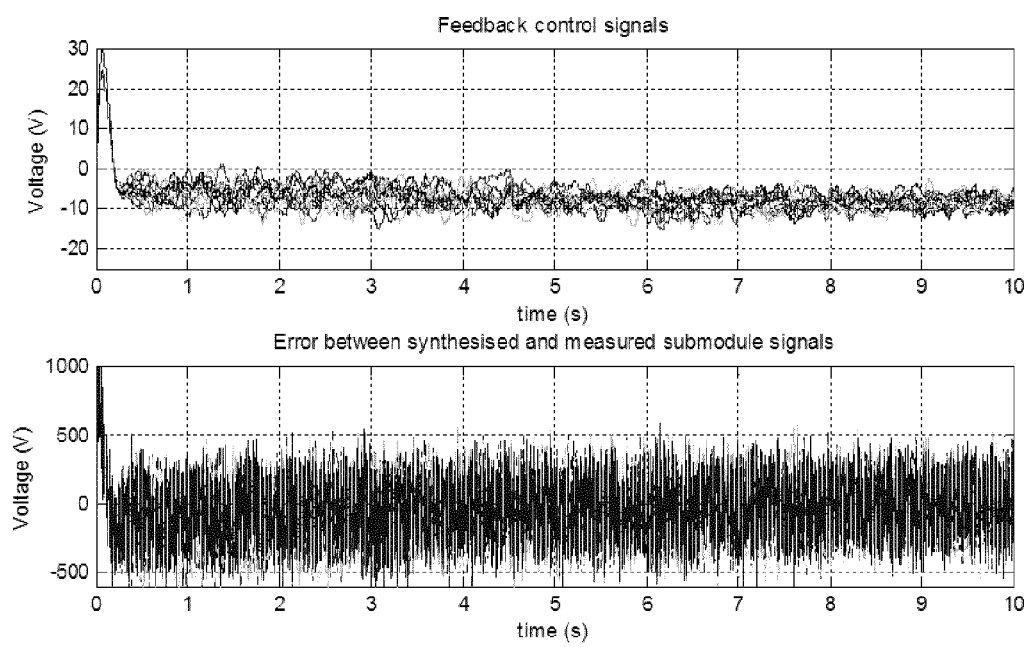
Figure 7A:
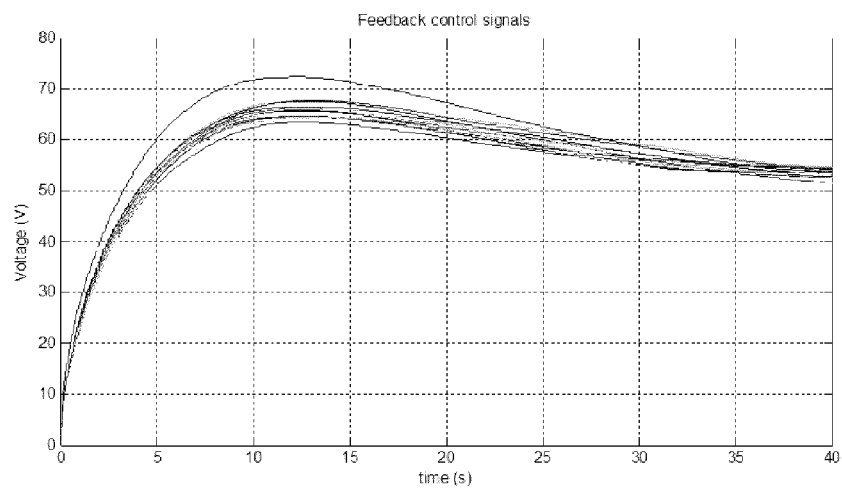
Figure 7B:
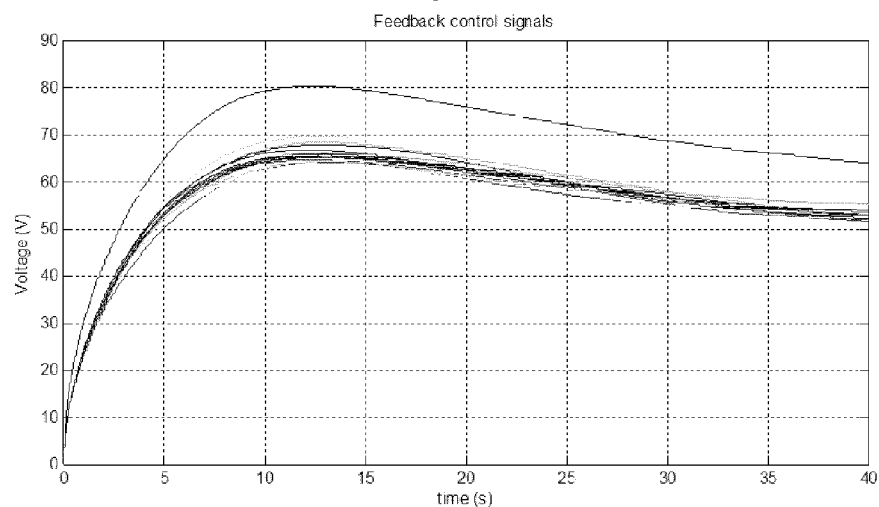
Figure 7C:
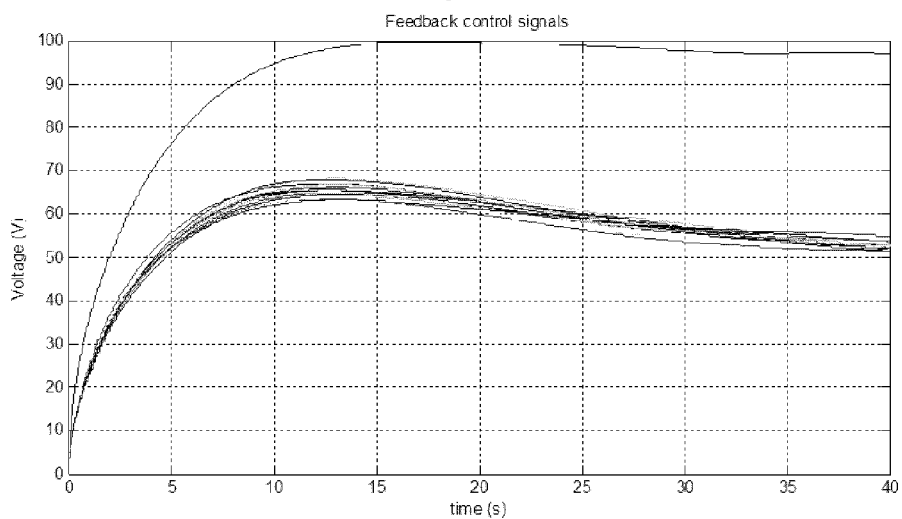
Figure 8:
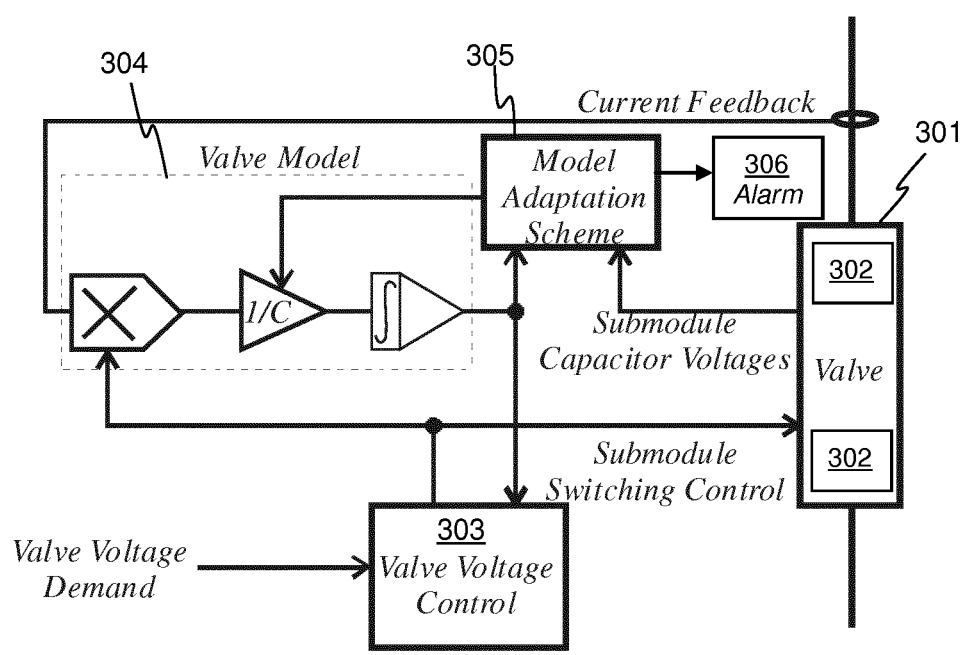

FIGS. 5*a* and 5*b* illustrate simulated examples of modelled and measured values of sub-module capacitor voltage and the resulting model control signal and error signals;

FIGS. 6*a* and 6*b* illustrate simulated examples of modelled and measured values of sub-module capacitor voltage and the resulting model control signal and error signals in the presence of noise;

FIGS. 7*a* to 7*c* illustrate an RMS measure of error between modelled and measured voltages and illustrate the effect of a change in capacitance; and FIG. 8 illustrates a control system for a voltage source converter according to another embodiment of the invention.

Figure 1:
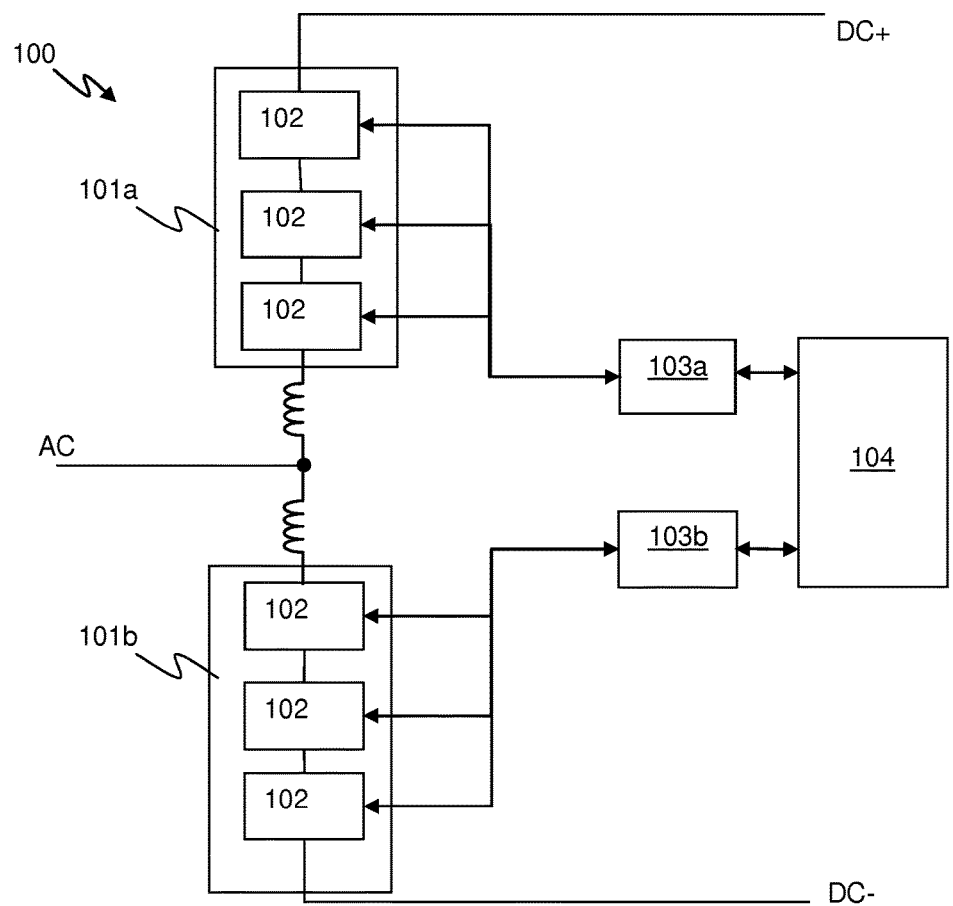
FIG. 1 illustrates the basic principles of a voltage source converter.

FIG. 1 illustrates the basic principles of a voltage source converter (VSC) and illustrates in general terms a type of multilevel modular converter (MMC). A first arm of the converter has a valve 101*a* and a reactor connected between a positive DC terminal, DC+, and an AC terminal. A second arm includes a second valve 101*b* and a reactor connected between a negative DC terminal, DC−, and the AC terminal. Each of the valves 101*a* and 101*b* comprises a plurality of sub-modules 102 which are, or can be, connected in series. FIG. 1 illustrates just three sub-modules for clarity but in practice there may be of the order of a few hundred sub-modules in each arm. For example MMCs have been proposed with of the order of 350 or more sub-modules in a valve. The sub-modules 102 may be grouped in one or more modules in each arm.

It will be noted that FIG. 1 illustrates the connections for converting between one AC waveform and DC or vice-versa, i.e. for converting to or from one phase of AC. For converting to/from three-phase AC there would be three AC terminals and each terminal would be separately connected to the positive and negative DC terminals by two converter arms as shown, thus for a VSC for converting to/from three phase AC there would be six converter arms in practice. It should also be noted that as used herein the terms positive DC and negative DC are defined with reference to a mid-point voltage and do not necessarily imply any particular polarity with respect to a ground reference.

Figure 2:
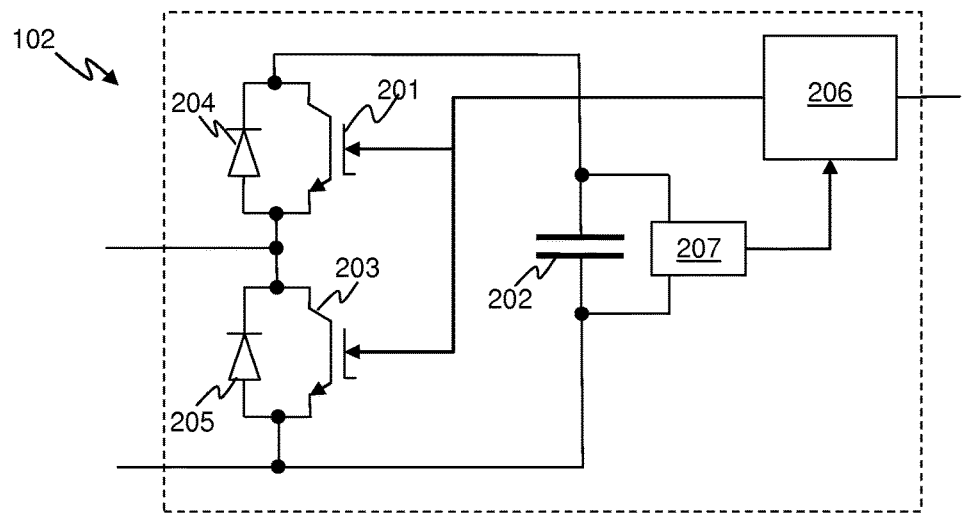
FIG. 2 illustrates the basic principles of a sub-module.

The basic structure of a sub-module is illustrated in FIG. 2. A first switching element 201, which typically comprises one or more insulated gate bipolar transistors (IGBT), is arranged in series with at least one energy storage element 202, which typically is a capacitor. A second switching element 203, which may also comprise one or more IGBTs, is coupled between the input and output to the sub-module. Both first and second switching elements 201 and 203 are also typically arranged in parallel with diodes 204 and 205 respectively.

In operation the sub-module may be switched between two switch states. In one state the first switching element 201 is switched on, i.e. the switch is closed, with the second switching element off, i.e. open, to connect the energy storage element in series with the other sub-modules. In the other state the second switching element 203 can be switched on, with the first switching element off, to bypass the energy storage element. In use a respective valve control unit 103*a*, 103*b* (shown in FIG. 1) controls switching of the sub-modules of each of the first and second valves. The valve control units may themselves by controlled by, and in some embodiments may form part of, a central control unit 104 for the VSC. By controlling the sequence of switching of the sub-modules to progressively vary the number of energy storage elements which are connected in series the voltage difference across each module can be stepped up and down in time with the AC voltage waveform to provide the desired power conversion.

It will be appreciated that FIG. 2 illustrates a sub-module with two switching elements arranged in a half-bridge arrangement. Other configurations of the sub-modules are possible, for instance a full-bridge arrangement with at least four switching elements.

Typically each sub-module will have its own sub-module control unit 206 for controlling the sub-module in response to commands from the valve control units 103a, 103b and/or central control unit 104.

To control the modules of the VSC the voltage of the energy storage device of each sub-module may be monitored by a voltage measuring unit 207, which may example comprise a potential divider arrangement using precision resistors. The measured voltage value may be provided as a feedback signal to valve control 103a/103b or central control unit 104, possibly via the sub-module control unit 206. The valve control unit may therefore receive indications of the voltages of each of the sub-modules of both the first and second modules and use such voltage information to select which sub-modules to enable, for instance to ensure voltage balancing of the energy storage devices.

In a large scale MMC with a relatively large number of sub-modules, e.g. of the order of hundreds or even thousands of sub-modules, it may be necessary to sample the voltages of the energy storage devices of the sub-modules at a relatively fast sample rate, e.g. of the order of a hundred microseconds or so, and process all of the samples in a fraction of the sample period to decide which sub-modules should be enabled. This results in quite strict limits on the amount of any signal processing such as filtering that can be applied to the sub-module capacitor feedback signals. It has been found however that these signals, in practice, may be relatively noisy and such noise may adversely affect the control of the VSC.

A similar issue exists with respect to deadbeat control of the VSC in which the valve current is measured and then used directly to calculate the valve voltage required to ensure the current is driven to a reference value within one sample. This control also requires the use of samples to be acquired and used at a rate which limits the amount of signal processing, if any, that can be applied to the measured samples but where the raw measured data itself may not be entirely suitable for using for control.

Embodiments of the invention therefore use at least one model module which models operation of the VSC to provide an indication of at least a first electrical parameter of the VSC which can be used for control.

In particular the model module may model the energy storage device of a sub-module and the first electrical parameter may be the voltage level of an energy storage device. The model can be used in the control process for the VSC and avoids the need to use the noisy voltage feedback signals directly for control of selection of the sub-modules to be connected into the arm of the VSC.

The modelled electrical parameter, i.e. voltage level of the energy storage device, may be compared to an actual measured value of the relevant parameter, e.g. a measured value of the voltage of an energy storage device, to generate a model control signal for controlling the model module to ensure that the modelled parameters, over time, match the measured value. In some embodiments adaptations to the model can be made over time to ensure that the model is accurate. As will be described in more detail later the measure of an error signal and/or the degree of any adaptations to the model can be used to monitor for any changes in the component of the VSC, such as changes in sub-module capacitance, and may be used to track any degradation in properties of the energy storage device and generate an alarm if necessary.

Figure 3:
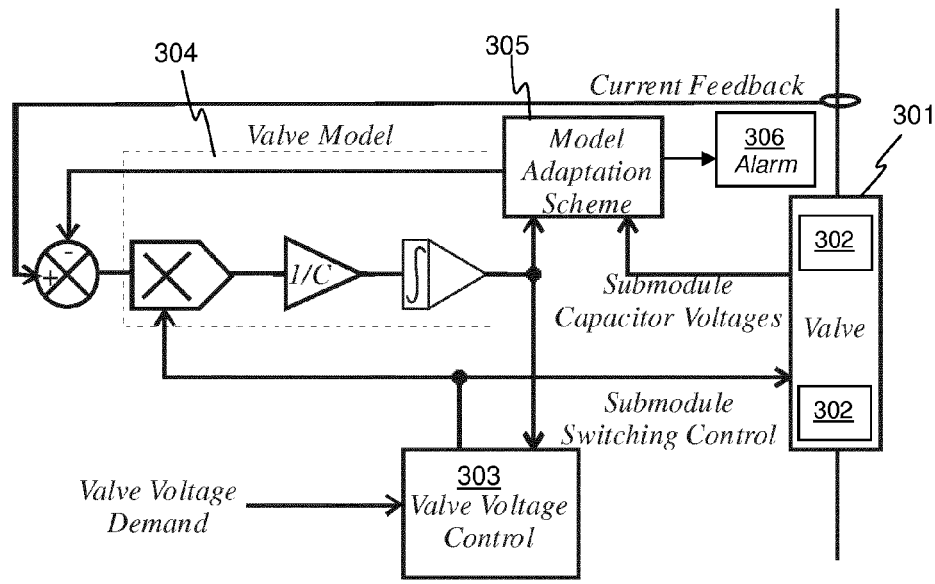
FIG. 3 illustrates a control system for a voltage source converter according to an embodiment of the invention.

FIG. 3 illustrates an embodiment of the invention. A valve 301 comprises a plurality of sub-modules 302 as described above. The sub-modules may be of the type as generally described with reference to FIG. 2. The valve 301 is controlled by valve voltage control circuitry 303 in accordance with an indication of valve voltage demand. The valve voltage control circuitry controls switching of the sub-modules of the valve in sequence to provide the required power conversion and may decide which sub-modules to switch in which order, for example to ensure voltage balancing of the energy storage devices of the sub-modules. In this embodiment the control system includes a model module 304 which models the valve and, in particular, the sub-modules of the valve based on one or more model parameters and the operation of the converter. The model module 304 thus receives the switching control signals from the valve voltage control circuitry 303 which determines which energy storage devices are connected in series in the arm of the VSC. The model module also receives at least one feedback signal of the electrical properties of the valve or part of the valve. In this embodiment a current feedback signal indicative of the current flowing in the converter arm is received. The model module can therefore model the voltages of the energy storage devices of the relevant sub-modules and output a value related to said voltages. The modelled value may be the actual modelled voltage level or a value which is related to the voltage level, such as a scaled version of the voltage or a modelled current.

FIG. 3 illustrates the principles of a relatively simple model for the energy storage devices of the sub-modules. The model module is responsive to the switching control signals from the valve voltage control circuitry 303 to model the voltages of the selected sub-modules accordingly. For the selected sub-modules the current signal may be scaled according to a parameter which is related to the capacitance of the relevant energy storage devices and then integrated to provide a voltage value for the relevant energy storage device(s). These modelled values of voltage for the sub-module energy storage devices are then passed to the valve voltage control unit 303 to be used in the control scheme for selecting the sub-modules to be enabled. In essence therefore the model module 304 may model the voltage of the energy storage device of a sub-module by modelling the change in voltage that would occur for a given energy storage device (when not bypassed) based on the current flowing in the valve.

It will be appreciated however that the exact form of the model may vary depending on the implementation and the control signals provided. For instance in addition to, or instead of, the feedback current signal indicative of the current flowing through the whole valve other current signals or voltage feedback signals could be used and the model would be adjusted accordingly. One skilled in the art would be aware of how to construct a desired model.

The modelled voltage values are noise free and thus can be used as the feedback control signals for the valve voltage control circuitry 303 without requiring any filtering. Thus the valve voltage control circuitry receives the modelled voltage values from the model module 304 and controls selection of the sub-modules based on the modelled voltages.

In use values related to the actual voltages of the energy storage devices, e.g. capacitors, of the sub-modules are measured and the model operation adapted as necessary so as to ensure that the output of the model substantially corresponds to the actually measured voltages. The control apparatus therefore includes model adaptation module 305 which can adapt the model. The model adaptation module receives the measured sub-module capacitor voltages and also the modelled voltages output from the model and, based on a comparison of the modelled values and measured values, can determine appropriate adjustments to be applied to the model. The measured value may be a direct measure of the voltage level of the capacitor of the sub-module or may be a measure of a related value, such as a measurement current.

As will be appreciated by one skilled in the art there are various ways in which the model may be adjusted so as to ensure that the model output matches the measured voltages. FIG. 3 illustrates an embodiment based on the Observer or Estimator principle where the model adaptation module is a servo type controller that generates a model control signal to add a compensating term to the model input (for each sub-module) to drive the modelled output, i.e. the modelled sub-module capacitor voltages, to match the measured values. As will be described later however other embodiments of the present invention may use other model adaptation techniques, for instance the model adaptation module may make use of the techniques of Model Reference Adaptive Control (MRAC). MRAC is a known control technique wherein a model is used as a reference for the system under control and parameters adjusted so that the output of the model and a measured value of the real system agree.

The exact nature of the adaptation module will clearly depend on the exact model used and the various model parameters. As mentioned above the model may be adapted by varying the value of a compensation term added to the signal path of the model at an appropriate point and thus a model control signal generated by the model adaptation module may be based on the value of the compensating term. Additionally or alternatively the model may be adapted by varying the value of at least one parameter and the model control signal may comprise a signal controlling the value of said parameter(s). For instance there may be at least one parameter related to the capacitance of the energy storage device of each sub-module. The model adaptation module may determine the amount of error between the modelled value and measured value and adjust the at least one parameter to reduce the error whilst maintaining the stability of the overall system. For ease the model may directly model the value being measured so that the adjustment is made to make the two values substantially match (within a certain tolerance). However in some instances the modelled value may be have a certain transfer characteristic with regard to the measured value which will need to be taken into account in ensuring the values correspond.

The result is that model adaptation module may therefore adapt the model over time to ensure that the modelled output agrees, at least within predetermined bounds, with the measured value. Such adaptation will be based upon the error between the measured and modelled values. However as it is the modelled values which are used for the control, i.e. for selection of the relevant sub-modes, this relaxes the time constrains as compared to using the measured values directly.

This means that in some embodiments the measured signals of sub-module capacitor voltage could be filtered or otherwise processed to reduce or remove noise before being compared to an appropriate model output for that sub-module. Thus the actual measurement signals may be used in the adaptation of the model to ensure that the model remains accurate but the processing of the measurement signals at least reduce the effects of noise. The output of the model is substantially noise free and thus can be used in the faster control of selection of the sub-models.

In some embodiments the control scheme of the model may provide an inherent degree of filtering to the measured signals of sub-module capacitor voltage and thus there may be no, or limited, processing of the measured signals before being used to determine a measure of the error between the modelled and measured values. This may mean that any noise in the measured signal is present in the resulting initial indication of error between the measured and modelled values. However the error signal may be processed, e.g. integrated or otherwise filtered as part of the process of adapting the model, e.g. to generate a model control signal, and thus this processing may remove the effect of noise. Again this results in the modelled values that are substantially noise free and which can be used for stable control of the VSC.

Any filtering of the measurement signals of the sub-module capacitor voltages could be applied in the model adaptation module 305 and/or at least some filtering could be applied in the sub-module 302 and/or by a filter arranged between the sub-modules and the model adaptation module.

Figure 4:
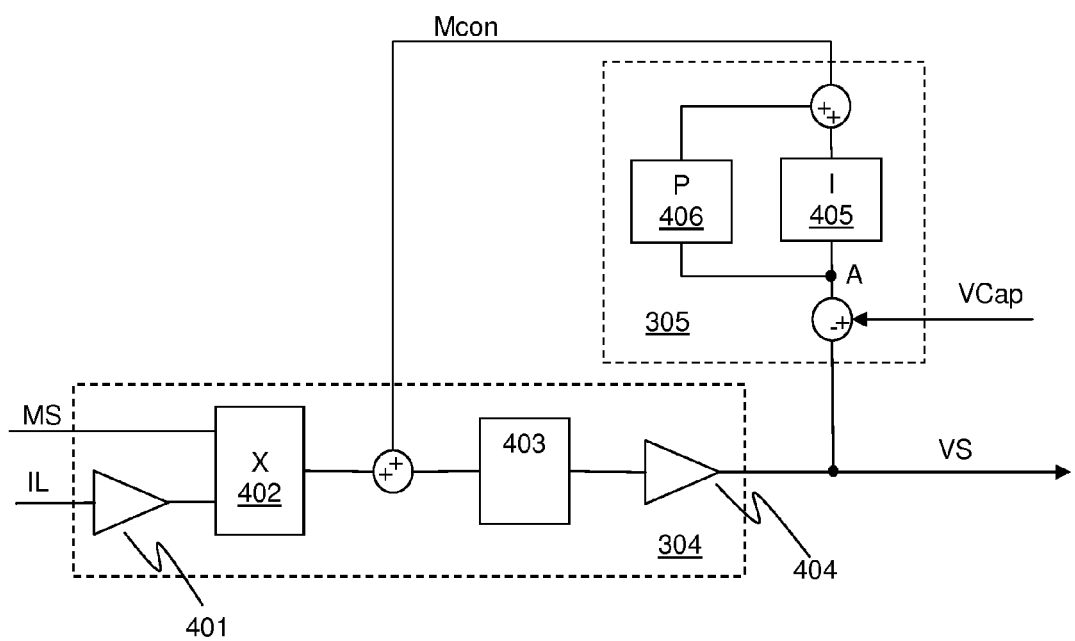
FIG. 4 illustrates one example of a model module and model adaptation module.

FIG. 4 illustrates a further example of an Observer or Estimated model such as described in FIG. 3. FIG. 4 illustrates a model module which receives a valve current signal (IL), which may be scaled by a suitable scaling component 401. The IL current signal is combined, by multiplier 402, with a vector of sub-module switching controls (MS) to give a vector representing the currents passing through all of the sub-modules. Where the switching signal for a given sub-module indicates the sub-module is not selected, i.e. MS=0, the current passing through the relevant capacitors is zero and when the switching signal for a given sub-module for indicates the sub-module is selected, i.e. MS=1, the current passing through the relevant capacitor is IL (scaled as appropriate).

Integrating this current vector by integrator 403 and scaling by a component 404, that scales by a parameter related to the sub-module capacitance for each sub-module, gives a vector of voltages VS that represent the sub-module capacitor voltages. These components comprise the model module 304 as discussed above.

For this particular embodiment the current signal is determined at a sampling instant and thus will be a constant value, whereas in reality the current through the capacitors will continually vary over the sample period. In this embodiment therefore the sampling process introduces a slight error and thus the synthesised, i.e. modelled, sub-module voltages would likely differ, at least slightly, from the true values and this error could lead to the modelled values drifting significantly from the true value over time. To correct for this error the model adaptation block 305 receives the measured values of the voltage of the sub-module capacitors (VCap) and derives the model control signal (Mcon). In this example the model adaptation block forms a type of proportional-integral (PI) controller.

In this embodiment the modelled sub-module voltage values (VS) are subtracted from the actual measured values of the voltage of the sub-module capacitors (VCap). The difference between the modelled values VS and measured values VCap of the sub-modular capacitor voltages is passed to the PI control which, for example, comprises an integrator 405 with a low gain value (the I term) and a first order filter 406, e.g. a band limited proportional term, again with a low gain. The resulting model control signal Mcon (which adapts the model) is then fed back and added as a compensating term to the input of the synthesising integrator function 403 so that the modelled sub-module voltages will be driven at low frequency to follow the measured signals. This arrangement forms a simple form of observer or estimator with inherent filtering of the measured values.

In order to prove the principle a detailed simulation of a VSC was implemented with a model as shown in FIG. 4 arranged as part of the Valve Base Electronics of a valve to control selection of the sub-modules of that valve.

It will of course be appreciated that on start-up the model adaption will not have been running to ensure that the modelled output matches the measured voltages and it may take a while for the model module output to stabilise to the correct values. In this simulation therefore the VSC was started using the measured sub-module voltages for initial control, but with the model module running in parallel. After a short period of time, sufficient to allow the model module output to reach a reasonable estimate of the sub-module voltages, the sub-module selection control was switched from using the measured voltages to using the modelled voltages. In practice there may be various ways in which the model control could be started. As mentioned the converter may be started using measured values for an initial period. The measured values may be too noisy for good long term control but this may be sufficient to allow start-up to a level where the model can be used and will provide stable control. In some embodiments a predetermined start up sequence may be used with predetermined model adaptation parameters and/or the model adaptation parameters may be adjusted for start-up to allow for faster correction on start-up. One skilled in the art of control systems will be aware of various ways the control system using the model module could be initialised.

After this period of start-up the selection of the sub-modules was controlled based on the modelled sub-module voltages.

FIG. 5a illustrates how the resulting modelled sub-module voltages VS (i.e. the Observed sub-module voltages determined by the observer) vary over time compared to the measured sub-module voltages VCap. It can be seen that the modelled voltages closely follow the actual measured sub-module voltages. FIG. 5b illustrates how the feedback model control signals output from the model adaption module 305 and the error between the modelled voltages VS and the measured voltages VCap (i.e. the signal at node A of FIG. 4) vary over time. In this simulation the control was switched to the modelled sub-module voltages at 1 s. It can be seen that while the error signal appears to remain reasonably consistent the compensation signals steadily reduce in variation. As mentioned above using the relatively simple model illustrated in FIG. 4 a certain error would be expected due to the fact that the current value is being sampled at an instant and thus does not correctly reflect the variation in current through the sub-modules that occurs throughout the sampling period. More sophisticated models could include a measure of valve current variation.

In order to determine the effect of noise on the measurement signals a simulated noise source was introduced acting on the measured voltage signals. FIG. 6 shows the resulting waveforms in this scenario when the model shown in FIG. 4 was used to control selection of the sub-modules. It would be expected that any noise in the measured sub-module voltages will be uncorrelated across the measurements, however the simulation included correlated noise as such correlated noise should represent a worst case that would normally destabilise the control.

FIG. 6a illustrates the modelled or Observed sub-module voltages against time and also the measured sub-module voltages. The effect of the noise on the measured sub-module voltages is apparent. However the modelled sub-module voltages are substantially noise free and have a similar form to the measured sub-module voltages in the absence of noise (as illustrated in FIG. 5a). This illustrates that the modelled sub-module voltages can be substantially noise free and used for control, even in the presence of significant noise (the level of noise simulated was far greater than the worst case expected in practice and the control still functioned well). FIG. 6b illustrates the model control signals output from the model adaption module 305, i.e., the feedback signals, and also the error between the modelled voltages VS and the measured voltages VCap in this simulated scenario. The error between the modelled and measured sub-module voltages exhibits a greater magnitude and more variation in this case, as would be expected with greater noise, but the feedback model control signals are similar to those illustrated in FIG. 5b. This illustrates that the control is working even in the presence of very significant noise in the measured sub-module voltages.

In some embodiments the model adaptation can occur at a rate which is slower than the sample rate necessary for control of selection of the sub-modules, i.e. the sample rate of the valve voltage control circuitry 303. In some embodiments therefore the sub-module capacitor values may be sampled at a rate which is slower than the sample rate of the modelled values. In other words the sampling frequency of measuring the actual capacitor voltage may be reduced compared to the rate that would be required if the measurement values were being directly used in control of selection of sub-modules.

As mentioned above the sub-module capacitors may be based on metallised film technology where the metallisation is patterned to provide areas connected by thin strips that act as fuses. If the insulation breaks down in any area the fuses can burn out effectively isolating the affected area from the rest of the capacitor and preventing complete failure. This allows the capacitor to continue to operate albeit with a reduced capacitance. This means that the value of the capacitance of the sub-module capacitance can vary over time.

As described above the model module may typically include model parameters that are related to the nominal capacitances of the sub-module capacitors. If however the capacitance of the sub-module has changed from its nominal value the relevant parameter for that sub-module will have an error associated with it. The model control, e.g. the model adaptation unit, will still act to maintain the modelled voltage for the relevant sub-module in line with the measured voltage and may adapt the model accordingly. In some embodiments however an error signal indicative of the error between the measured and modelled voltages may be used as an indication of any change in capacitance of the sub-modules. The control apparatus according to embodiments of the invention thus also provides a way of determining any changes in the properties of the energy storage devices of the sub-modules, e.g. any change in the value of capacitance of sub-module capacitors.

Simplistically speaking any error between the assumed sub-module capacitance (as represented by the relevant model parameter) and the actual sub-module capacitance will, in the absence of correction, result in an error in the modelled sub-module voltage. The model adaptation module will therefore typically have to apply a greater correction in order to maintain the modelled output in line with the measured value. This degree of correction may be used as an indication of the accuracy of the model and thus used as an indication of any possible error in the assumed capacitance of the sub-module. In some embodiments the model adaption may directly adjust the model parameters and adjustments to the model parameters may be used to determine any change in capacitance.

Using the model illustrated in FIG. 4 the effect of a change in sub-module capacitance was simulated. The VSC was simulated with all sub-modules having the same value of capacitance, in this case 4 mF. The simulation was then repeated but the value of capacitance of one sub-module was reduced from 4 mF to 3.5 mF. It was found that the error and the feedback model control signals generated in this scenario were visually little changed from those shown in FIG. 5*b*. Reducing the capacitor value further to 3 mF showed that the apparent error for that sub-module appeared to remain as largely of the same order as the other sub-modules, meaning that an error with that particular sub-module was difficult to spot directly. However it was noted that the variation in the error signal and the resulting model feedback control signal was greater, suggesting that the control was struggling to maintain the relevant sub-module capacitor voltage in line with the measured value.

This increased variation in the error signal and/or the feedback model control signal determined by the model adaptation module 305 may be used as an indication of a possible error in the assumed sub-module capacitance. In some embodiments this variation may be determined by processing the error signal and/or the model control signal. In one embodiment the error signal indicating the error between the modelled sub-module capacitor voltage VS and measured sub-module capacitor voltage VCap may be processed to monitor the root mean square (RMS) value of the relevant signal, for instance by applying a second order sampled data filter.

FIG. 7 illustrates the RMS value of Observer error signal (i.e. the signal at node A of FIG. 4) over time in three different scenarios. FIG. 7*a* illustrates the RMS error signal value where each sub-module has a capacitance of 4 mF. This shows that while the start-up transient causes an initial overshoot the system does settle with a good grouping of the signals. In this scenario the modelled sub-module voltages are controlled and maintain a good grouping. There is some variation in the error and corresponding feedback model control signals, but at a relatively low level.

FIG. 7*b* illustrates the RMS error signal value where one sub-module capacitance is reduced to 3.5 mF. It can be seen that the RMS value for one sub-module has risen significantly above the other curves, which remain well grouped. This variation in error signal is reasonably clear in the plot of RMS values whereas the effect is less clear from consideration of the modelled sub-module voltages directly. FIG. 7*c* shows a plot of RMS values of the error signals when the relevant sub-module capacitance is reduced further to 3 mF. In this case the plot of error signal RMS value is even more clearly distinct from the grouping of the other plots and clearly indicates a greater variance in error signal.

This illustrates that a measure of RMS value of an error signal, representing the error between the modelled and measured sub-module capacitor voltages, or possible consequent model control signals, can be used as a mean of determining a change in properties of the modelled component, in this instance a change in the value of the capacitance of the capacitor of the sub-module.

The plots shown in FIGS. 7*a* to 7*c* were obtained without any significant noise affecting the measured values of sub-module capacitor voltages. It will be appreciated that the presence of noise will tend to increase the amount of random error between the measured and modelled voltages. However even in the presence of significant noise a significant change in capacitance of a sub-module away from its nominal value (and hence assumed value for the model) resulted in a clear difference in the RMS value of the error signal for that sub-module compared to the other sub-modules and/or historic data for that sub-module under similar operating conditions.

As mentioned above the model adaptation module is arranged to determine the error between the measured sub-module voltages and modelled sub-module voltages as part of the control scheme for adapting the modelled output to match the measured values. In some embodiments therefore the model adaptation module may also determine whether a measure of the error between the measured and modelled voltage exceeds a threshold or lies within or without a certain range. The measure may be a measure of the RMS value of a determined error in voltage or a feedback compensation signal. The range or threshold may be set at predefined values, which may vary according to the operating conditions of the VSC and/or the threshold or ranges could be relative thresholds or ranges set by reference to the values of errors signals for one or more other sub-modules and/or previous values for that converter. For instance the model adaption module may determine if the measure of error, e.g. RMS error value, changes by more than a certain percentage from a previous value for a given sub-module and/or from an average value for one or more other sub-modules. Referring back to FIG. 3 in the event that the measure of error value for a sub-module does vary significantly an alarm could be generated by an alarm module 306 and/or various control actions initiated, for instance the relevant sub-module could be deactivated and bypassed and/or some sort of self-test routine could be initiated for the relevant sub-module.

The embodiments discussed so far have used a model based on the estimator or Observer type principle with a servo type model adaptation adding a compensating signal to an appropriate part of the signal path. As mentioned other embodiments of the present invention may use other model adaptation techniques, for instance Model Reference Adaptive Control (MRAC). FIG. 8 illustrates another embodiment which uses the techniques of MRAC. The basic components of the model are similar to those discussed above in relation to FIG. 3 and similar components are identified using the same reference numerals. FIG. 8 illustrates that the model adaptation module 305 may generate a model control signal to adjust a parameter of the model related to the capacitance of the sub-module.

The model adaptation module 305 may determine an error between the modelled voltage and measured voltage and adjust the parameter to reduce the error, i.e. to ensure that the output matches the measured values. In some embodiments the model adaptation module may only act to adapt the model parameters in response to a relatively long term difference between the model values and measured values. In other words there may be a time constant associated with the adaptation module so that any error between the modelled and measured voltage values for a given energy storage device must remain above a certain threshold value for a relatively long period of time before any adjustment is made so that the adaptation module does not respond to short term noise effects. Additionally or alternatively there may be a maximum rate of adjustment of the model parameter(s) and/or there may be a degree of hysteresis applied to the adjustment. Thus the adaptation scheme may inherently provide a degree of filtering of any noise in the measurement signals and in some instances separate filtering of the measurement signals may not be required.

In this embodiment the adaptation of the model parameter is thus an indication of the error between the modelled and measured voltages and the adjustment of the model parameter can be used as an indication that the properties of the relevant components have changed. Thus the model parameter relates to capacitance of the relevant sub-module can be used a proxy for the actual capacitance and any changes to the model parameter for that sub-module may indicate a degradation of the actual capacitance for that sub-module.

If a sub-module capacitor were operating with a first value of capacitance the model adaptation module would have adapted the model parameters to correspond to such a value of capacitance. If the capacitor were then to degrade to a second, lower, value of capacitance the model output for that sub-module would start to deviate from the measured value. The model adaptation unit would then operate to adjust the model parameters, e.g. a parameter related to capacitance, until the modelled output matched the actually measured value. By tracking the evolution of the parameter related to capacitance for a given sub-module any changes in capacitance of that module can be determined.

In some embodiments therefore at least one parameter of the model related to the properties of the energy storage device may be monitored. The parameter may be a value that changes in accordance with the capacitance of the energy storage device. In some embodiments the relevant parameter value for a sub-module may therefore be used as an indication of the capacitance of the relevant sub-module. The parameter may be monitored to detect any significant changes, for instance the value may be monitored against one or more threshold values and/or any variation in parameter value greater than a threshold around may be determined. If the value exceeds the relevant threshold an alarm could be generated by an alarm module 306 and/or various control actions initiated, for instance the relevant sub-module could be deactivated and bypassed and/or some sort of self-test routine could be initiated for the relevant sub-module.

As mentioned above the voltage of the sub-module energy storage devices may be measured by any suitable voltage measuring apparatus, such as a potential divider arrangement. Accurate measurement of the sub-module voltages is clearly desirable for good control of the VSC and thus accurate measuring devices are typically used and arranged so as to have a stable operating range. It has been found however that, in use, environmental changes can potentially lead to changes in the voltage measuring apparatus, for instance in the resistance values of precision resistors. Such an error in measurement is clearly undesirable. Were a VSC to operate with a control scheme where the measurement values are directly used to control selection of the sub-modules such an error in measurement could lead to errors in operation of the VSC. Ultimately such errors in operation may be detected by other sensors monitoring the operation of the VSC, however in such a system it would be difficult to determine whether any sub-modules were affected by inaccurate measurement.

In a control apparatus according to embodiments of the invention if the devices measuring the voltages of the sub-module capacitors developed inaccuracies the resulting measurement values for the relevant sub-modules would start to deviate from the relevant modelled values. The model adaptation module would then adapt the model so that the modelled values did match the (incorrect) measurement values—in the same way as if the capacitance of the capacitor of the sub-module had changed. The adjustment of the model can be monitored as described above and used to identify a possible measurement error. For example if an indication of the general level of error, such as the RMS value of an error signal or the level of adjustment of model parameters exceeds certain predetermined bounds an appropriate alarm could be generated. In some instances the type of adaptation applied may indicate that there is a problem in measurement. For instance in some applications a relatively sudden increase in capacitance may be very unlikely and thus adaptation of the model in a way which corresponds to a sudden increase in capacitance may indicate a likely measurement error. In other instances a certain adaptation may indicate either an unacceptable degradation in capacitance or a measurement error but it may not be possible to discriminate between these possibilities just based on the adaptation of the model parameters. In such a case however an alarm for the relevant module could be raised and further use of the module suspended and/or some self test routines could be performed, for example the measurement device could be connected to a reference voltage or current source.

Use of a suitable model module for modelling the energy storage device of the sub-module of a VSC together with a suitable model adaptation module thus allows both the model output to be used to control selection of the sub-modules and also provides a means to detect any changes in the properties of the energy storage device of the sub-module. In other words the model module and model adaptation module collectively provide noise free signals of sub-module capacitor voltage for use in control of the valve and also provide an indication of any degradation in capacitance of the module or warning of a possible measurement error. It will be noted however that in some embodiments the model may be used for control of the selection of the sub-modules without necessarily also monitoring any change in properties of the energy storage device. Equally in some embodiments the model output could be compared to the measured values to determine any changes in properties without necessarily using the modelled outputs in control of section of the sub-modules.

The model module may be implemented as a hardware module or a software module or a combination of both hardware and software. Thus the control apparatus may comprise processing circuitry for running a computational model and could for instance comprise one or more suitably programmed processors. The processor could be a conventional CPU or a suitably programmed logic array such as an FPGA array or the like. Additionally or alternatively the modelling circuitry could comprise one or more circuit components such as amplifiers or like arranged so as to model the behaviour of the energy storage device of the sub-module. Likewise the model adaptation module may be implemented as a hardware module and/or a software module.

In some embodiments there may a centralised model module for the valve for receiving the sub-module switching control signals from the valve voltage control circuitry and also at least one measurement signal from the valve, e.g. a current feedback signal. In such an embodiment the model may comprise a plurality of model elements each modelling a separate energy storage device of a sub-module. The model adaptation module may also be centralised for the valve. In other embodiments each sub-module may be modelled by a separate model module and each sub-module may include its own model module for modelling the energy storage device of that sub-module.

The embodiments discussed above have been described in relation to methods and apparatus for monitoring the voltages of the energy storage devices of the sub-modules of a valve of a VSC for allowing control over the selection of the sub-modules. The use of a model module to provide modelled voltages which is driven to match the measured values allows a method of combined monitoring and filtering of the actual voltage values but without the time penalty of filtering the measured values directly before using in the sub-modules selection control. This approach is particularly suited to monitoring the voltages of the energy storage devices of the sub-modules, i.e. the sub-module capacitors. However the same principles could be applied to monitoring of other electrical parameters of the VSC which are used for control where the measured values may suffer from noise but the control requirements means that no or limited filtering can be applied.

In particular a similar approach may be applied to monitoring of the valve current for valve current control, e.g. deadbeat control in which the valve current is measured and then used directly to calculate the valve voltage required to ensure the current is driven to a reference value within one sample. Thus the electrical parameter modelled may in some embodiments be the valve current.

In general therefore embodiments of the invention relate to a methods and apparatus for controlling operation of a voltage source converter based on at least one model which models the energy storage devices of the sub-modules of the converter. The actual voltages of the energy storage elements of the sub-modules are measured and compared to the relevant modelled values and one or more model parameters adjusted as necessary to keep the modelled values matching the measured values. Embodiments of the invention can therefore be used to monitor the voltages of the energy storage devices of the sub-modules and/or to detect any changes in the properties of the energy storage devices.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A control apparatus for a voltage source converter, the voltage source converter comprising an arm connecting an alternating current terminal to a direct current terminal, the arm comprising a valve and a first reactor, the valve comprising a plurality of sub-modules, a plurality of energy storage devices, and a plurality of switching elements, each of the plurality of sub-modules comprising one of the plurality of energy storage devices and at least one of the plurality of switching elements, the control apparatus comprising:
a valve voltage control configured to control the plurality of switching elements to selectively connect the plurality of energy storage devices into the arm;
a model module configured to generate a modelled value of a voltage of at least one of the plurality of energy storage devices, wherein the modelled value of the voltage of the at least one of the plurality of energy storage devices is based on:
a measured output current of the valve;
the control of the plurality of switching elements by the valve voltage control; and
a capacitance value of at least one of the plurality of energy storage devices; and
wherein the valve voltage control is configured to control the plurality of switching elements based on the modelled value of the voltage of the at least one of the plurality of energy storage devices.

2. The control apparatus of claim 1, wherein then model module is configured to generate a modelled value of a voltage of at least one of the plurality of energy storage devices by:
scaling the measured output current by the capacitance of the at least one of the plurality of energy storage devices; and
integrating the scaled measured output current.

3. The control apparatus of claim 1, wherein the model module is configured to:
combine the measured output current with a vector of sub-module switching controls to give a vector representing the currents passing through all of the sub-modules, wherein the vector of sub-module switching controls indicates whether each sub-module is selected or not selected;
integrate the vector representing the currents; and
scale the vector by the capacitance value of at least one of the plurality of energy storage devices.

4. The control apparatus of claim 1, a model adaptation module configured to:
receive the modelled value of the voltage of the at least one of the plurality of energy storage devices;
receive a measured value of the voltage of the at least one of the plurality of energy storage devices; and
determine an error between the modelled value of the voltage of the at least one of the plurality of energy storage devices and the measured value of the voltage of the at least one of the plurality of energy storage devices.

5. The control apparatus of claim 4, wherein the model adaptation module is further configured to adapt a model based on the error such that the modelled value of the voltage of the at least one of the plurality of energy storage devices more accurately represents the measured value of the voltage of the at least one of the plurality of energy storage devices.

6. The control apparatus of claim 5, wherein adapting the model comprises generating a compensation term that is added to the measured output current of the valve.

7. The control apparatus of claim 6, wherein the compensation term is based on the error that is passed through a proportional-integral controller.

8. The control apparatus of claim 7, wherein the proportional-integral controller includes a low gain value and a first order filter.

9. The control apparatus of claim 4, wherein the model adaptation module is further configured to determine a root mean square value of the error and compare the root mean square value of the error to a threshold value.

10. The control apparatus of claim 4, wherein the model adaptation module is further configured to compare the error to a threshold value.

11. The control apparatus of claim 4, wherein the model adaptation module is further configured to filter the measured value of the voltage of the at least one of the plurality of energy storage devices.

12. The control apparatus of claim 4, wherein the valve output current is sampled at a rate that is greater than a rate at which the measured value of the voltage of the at least one of the plurality of energy storage devices is sampled.

13. A voltage source converter, comprising:
- a first arm and a second arm, the first arm connecting an alternating current terminal to a positive direct current terminal and the second arm connecting the alternating current terminal to a negative direct current terminal;
- the first arm comprising a first valve and a first reactor and the second arm comprising a second valve and a second reactor;
- the first valve comprising a plurality of first sub-modules, a plurality of first energy storage devices, and a plurality of first switching elements, each of the plurality of first sub-modules comprising one of the plurality of first energy storage devices and at least one of the plurality of first switching elements;
- the second valve comprising a plurality of second sub-modules, a plurality of second energy storage devices, and a plurality of second switching elements, each of the plurality of second sub-modules comprising one of the plurality of second energy storage devices and at least one of the plurality of second switching elements;
- a first valve voltage control configured to control the plurality of first switching elements to selectively connect the plurality of first energy storage devices into the first arm;
- a second valve voltage control configured to control the plurality of second switching elements to selectively connect the plurality of second energy storage devices into the second arm;
- a first model module configured to generate a modelled value of a voltage of at least one of the plurality of first energy storage devices, wherein the modelled value of the voltage of the at least one of the plurality of first energy storage devices is based on:
  - a measured output current of the first valve;
  - the control of the plurality of first switching elements by the first valve voltage control; and
  - a capacitance value of at least one of the plurality of first energy storage devices; and
- wherein the first valve voltage control is configured to control the plurality of first switching elements based on the modelled value of the voltage of the at least one of the plurality of first energy storage devices;
- a second model module configured to generate a modelled value of a voltage of at least one of the plurality of second energy storage devices, wherein the modelled value of the voltage of the at least one of the plurality of second energy storage devices is based on:
  - a measured output current of the second valve;
  - the control of the plurality of second switching elements by the second valve voltage control; and
  - a capacitance value of at least one of the plurality of second energy storage devices; and
- wherein the second valve voltage control is configured to control the plurality of second switching elements based on the modelled value of the voltage of the at least one of the plurality of second energy storage devices.

* * * * *